(12) United States Patent
Kaneko et al.

(10) Patent No.: US 11,842,887 B2
(45) Date of Patent: Dec. 12, 2023

(54) FILM FORMATION APPARATUS

(71) Applicant: ULVAC, INC., Chigasaki (JP)

(72) Inventors: Toshinori Kaneko, Chigasaki (JP); Tetsuhiro Ohno, Chigasaki (JP)

(73) Assignee: ULVAC, INC., Chigasaki (JP)

( * ) Notice: Subject to any disclaimer, the term of this patent is extended or adjusted under 35 U.S.C. 154(b) by 704 days.

(21) Appl. No.: 16/321,677

(22) PCT Filed: Jun. 28, 2018

(86) PCT No.: PCT/JP2018/024599
§ 371 (c)(1),
(2) Date: Jan. 29, 2019

(87) PCT Pub. No.: WO2019/004359
PCT Pub. Date: Jan. 3, 2019

(65) Prior Publication Data
US 2021/0296097 A1    Sep. 23, 2021

(30) Foreign Application Priority Data
Jun. 29, 2017    (JP) ................................ 2017-127092

(51) Int. Cl.
*H01J 37/32* (2006.01)
*C23C 14/50* (2006.01)
*C23C 14/34* (2006.01)

(52) U.S. Cl.
CPC ........ *H01J 37/32715* (2013.01); *C23C 14/34* (2013.01); *C23C 14/50* (2013.01); *H01J 2237/2007* (2013.01); *H01J 2237/332* (2013.01)

(58) Field of Classification Search
None
See application file for complete search history.

(56) References Cited

U.S. PATENT DOCUMENTS 6,126,382 A * 10/2000 Scales ..................... H01L 21/68
414/757
6,277,198 B1 * 8/2001 Yao ........................ C23C 14/042
24/570
(Continued)

FOREIGN PATENT DOCUMENTS

| CN | 201883141 | 6/2001 |
| CN | 101080303 | 11/2007 |

(Continued)

OTHER PUBLICATIONS

Office Action from related Chinese Application No. 201880002935.X dated Jun. 19, 2020. English translation attached.
(Continued)

*Primary Examiner* — Jeffrie R Lund
*Assistant Examiner* — Tiffany Z Nuckols
(74) *Attorney, Agent, or Firm* — Grossman, Tucker, Perreault & Pfleger, PLLC

(57) ABSTRACT

A film formation apparatus of the present invention is a film formation apparatus which performs deposition on a substrate to be processed, and includes a supply device that is disposed in an evacuable vacuum chamber and supplies a deposition material, and a holding device that holds the substrate to be processed during deposition. The holding device includes a deposition preventing plate that covers a region to which the deposition material is adhered in the holding device, a holder that holds the substrate to be processed, and a position setter that sets a position of the substrate to be processed when the deposition preventing plate and the holder sandwich and hold the substrate to be processed. The position setter includes a roller that comes into contact with a peripheral edge end surface portion of the substrate to be processed.

7 Claims, 4 Drawing Sheets

(56) References Cited

U.S. PATENT DOCUMENTS

| | | | | |
|---|---|---|---|---|
| 6,555,164 B1* | 4/2003 | Yudovsky | ......... | H01L 21/68728 427/444 |
| 2006/0207508 A1* | 9/2006 | Leung | ............... | H01L 21/68778 118/728 |
| 2011/0209989 A1* | 9/2011 | Li | ............................ | C23C 14/34 204/298.15 |

FOREIGN PATENT DOCUMENTS

| | | |
|---|---|---|
| CN | 105980595 | 9/2016 |
| JP | A-61-236138 | 10/1986 |
| JP | A-04-348515 | 12/1992 |
| JP | 06-252245 | 9/1994 |
| JP | 11-021667 | 1/1999 |
| JP | 11-145082 | 5/1999 |
| JP | 2000-336476 | 12/2000 |
| JP | 2005-077845 | 3/2005 |
| JP | 2006-086238 | 3/2006 |
| JP | 5309150 | 7/2013 |
| JP | 5869560 | 1/2016 |
| KR | 10-2003-0034711 | 5/2003 |
| KR | 10-2012-0134368 | 12/2012 |
| KR | 10-2013-7006250 | 12/2013 |

OTHER PUBLICATIONS

Office Action from related Korean Application No. 10-2019-7002526 dated Jun. 3, 2020. English translation attached.

International Search Report from corresponding PCT Application No. PCT/JP2018/024599 dated Oct. 2, 2018. English translation attached.

Office Action from related Korean Application No. 10-2019-7002526 dated Sep. 1, 2020. English translation attached.

Notice of Allowance from related application CN201880002935.X dated Apr. 25, 2021.

* cited by examiner

FILM FORMATION APPARATUS

TECHNICAL FIELD

The present invention relates to a film formation apparatus, and particularly to a technology suitably used for deposition such as sputtering, chemical vapor deposition (CVD), or the like.

Priority is claimed on Japanese Patent Application No. 2017-127092, filed in Japan on Jun. 29, 2017, the content of which is incorporated herein by reference.

BACKGROUND ART

In the fields of semiconductor devices or flat panel displays (FPD), a sputtering apparatus is used as an apparatus for forming various types of thin film.

In a general sputtering apparatus, a cathode for sputtering is provided in a chamber, and an object to be processed (substrate) is disposed to face a target attached to the cathode with a predetermined space therebetween in a depressurized chamber.

Next, Ar gas (inert gas) is introduced into the chamber, a negative voltage is applied to the target in a state in which the object to be processed is connected to the ground so that discharge is performed, and Ar ions ionized from the Ar gas by the discharge collide with the target.

Then, when particles ejected from the target adhere to the object to be processed, a deposition process is performed.

As an example of such an apparatus, as disclosed in Patent Document 1, a technology of performing deposition on a substrate in a state in which the substrate is positioned and supported by a clamping mechanism is known.

PRIOR ART DOCUMENTS

Patent Documents (Patent Document 1) Japanese Patent No. 5309150
(Patent Document 2) Japanese Patent No. 5869560

SUMMARY OF THE INVENTION

Problems to be Solved by the Invention

However, as described in Patent Document 2, for example, there are cases in which processing with a large deposition amount is performed such as performing deposition processes of a plurality of types consecutively. In this case, deposits are deposited on a clamping mechanism which is a movable portion in a deposition chamber, an amount of the deposits increases, and the deposits become a source of particle generation which causes deposition defects. For this reason, there was a demand for avoiding provision of a clamping mechanism.

However, when a clamping mechanism is not provided, generation of particles can be reduced, but a problem occurs in that an accuracy of substrate alignment in a deposition process cannot be sufficiently maintained.

The present invention has been made in view of the above circumstances, and is intended to achieve the following objects.
  1. Generation of particles can be reduced even when a deposition amount increases.
  2. An accuracy of substrate alignment can be maintained in a deposition process.

Means for Solving the Problems

A film formation apparatus according to one aspect of the present invention is a film formation apparatus which performs deposition on a substrate to be processed, and includes a supply device that is disposed in an evacuable vacuum chamber and supplies a deposition material, and a holding device that holds the substrate to be processed during deposition. The holding device includes a deposition preventing plate that covers a region to which the deposition material is adhered in the holding device, a holder that holds the substrate to be processed, and a position setter that sets a position of the substrate to be processed when the deposition preventing plate and the holder sandwich and hold the substrate to be processed. The position setter includes a roller that comes into contact with a peripheral edge end surface portion of the substrate to be processed.

In the film formation apparatus according to one aspect of the present invention, the position setter may be provided in the holding device at positions that come into contact with respective edge portions of the substrate to be processed which are at positions opposite to each other.

In the film formation apparatus according to one aspect of the present invention, a driving device that causes the deposition preventing plate and the holder to separate from and come close to each other when the deposition preventing plate and the holder sandwich and hold the substrate to be processed may be provided outside the chamber.

In the film formation apparatus according to one aspect of the present invention, the roller may be provided on the deposition preventing plate.

In the film formation apparatus according to one aspect of the present invention, the roller may be provided on the holder.

In the film formation apparatus according to one aspect of the present invention, the holding device may include a support member that comes into contact with a peripheral edge end surface portion of the substrate to be processed.

In the film formation apparatus according to one aspect of the present invention, the support member may be provided on the deposition preventing plate.

In the film formation apparatus according to one aspect of the present invention, the support member may include a substrate support that comes into contact with at least a peripheral edge end surface portion of the substrate to be processed, and the substrate support may be movable in a normal direction of the peripheral edge end surface portion in a direction along a surface of the substrate to be processed and may apply a force to a center of the substrate to be processed.

A film formation apparatus according to one aspect of the present invention is a film formation apparatus which performs deposition on a substrate to be processed, and includes a supply device that is disposed in an evacuable vacuum chamber and supplies a deposition material, and a holding device that holds the substrate to be processed during deposition. The holding device includes a deposition preventing plate that covers a region to which the deposition material is adhered in the holding device, a holder that holds the substrate to be processed, and a position setter that sets a position of the substrate to be processed when the deposition preventing plate and the holder sandwich and hold the substrate to be processed. The position setter includes a roller that comes into contact with a peripheral edge end surface portion of the substrate to be processed. Thereby, when the deposition preventing plate and the holder sandwich the substrate to be processed, due to an operation in which the deposition preventing plate and the holder come close to each other, the peripheral edge end surface portion of the substrate to be processed comes into contact with the roller and is positioned at a predetermined position with respect to the deposition preventing plate. Thereby, positioning of the substrate to be processed of which the peripheral edge end surface portion is in contact with the rotating roller is performed without damage simply by the operation in which the deposition preventing plate and the holder come close to each other. Therefore, a deposition process can be performed on the substrate to be processed in an accurately positioned state.

In the film formation apparatus according to one aspect of the present invention, the position setter is provided in the holding device at positions that come into contact with respective edge portions of the substrate to be processed which are at positions opposite to each other. Thus, the position setter comes into contact with the respective edge portions of the substrate to be processed which are at positions opposite to each other, and thereby the substrate to be processed can be positioned at a predetermined position with respect to the deposition preventing plate. Further, in the film formation apparatus according to one aspect of the present invention, it is preferable that a plurality of position setters be provided in the holding device so that the position setters come into contact with the respective edge portions positioned on sides of the substrate to be processed intersecting each other. In this case, positioning of the substrate to be processed can be performed in a plurality of directions in an in-plane direction of the substrate to be processed.

In the film formation apparatus according to one aspect of the present invention, a driving device that causes the deposition preventing plate and the holder to separate from and come close to each other when the deposition preventing plate and the holder sandwich and hold the substrate to be processed is provided outside the chamber. Thereby, since a drive source or the like serving as a particle generation source is not disposed in the chamber which is a space for processing, occurrence of contamination in the space for processing can be prevented and a volume of the chamber can be reduced.

Further, in the film formation apparatus according to one aspect of the present invention, the roller is provided on the deposition preventing plate. Thereby, a position of the substrate to be processed can be accurately set at a place corresponding to the disposition position of the roller on the deposition preventing plate by the operation in which the deposition preventing plate and the holder come close to each other when the substrate to be processed is sandwiched therebetween.

Further, in the film formation apparatus according to one aspect of the present invention, the roller is provided on the holder. Thereby, a position of the substrate to be processed can be set at a place corresponding to the disposition position of the roller on the holder and position setting of the substrate to be processed with respect to the deposition preventing plate which is set corresponding to the holder can be performed by the operation in which the deposition preventing plate and the holder come close to each other when the substrate to be processed is sandwiched therebetween.

Also, the holding device includes a support member that comes into contact with a peripheral edge end surface portion of the substrate to be processed. Thereby, occurrence of breakage or the like at an edge portion of the substrate to be processed can be prevented even when the substrate to be processed is supported by the support member coming into contact with the peripheral edge end surface portion of the substrate to be processed.

Also, the support member is provided on the deposition preventing plate. Thereby, the substrate to be processed can be supported at a place corresponding to a disposition position of the support member on the deposition preventing plate. Further, the substrate to be processed can be supported such that a position of the substrate to be processed with respect to the deposition preventing plate does not change during deposition processing.

In the film formation apparatus according to one aspect of the present invention, the support member includes a substrate support that comes into contact with at least a peripheral edge end surface portion of the substrate to be processed, and the substrate support is movable in a normal direction of the peripheral edge end surface portion in a direction along a surface of the substrate to be processed and applies a force to a center of the substrate to be processed. As a result, occurrence of breakage or defects in an edge portion of the substrate to be processed can be prevented. Further, applying a force to the center of the substrate to be processed means a direction in which a load of the substrate to be processed applied to the substrate support can be supported.

Effects of the Invention

According to an aspect of the present invention, it is possible to achieve effects in that generation of particles can be reduced and an accuracy of the substrate alignment in a deposition process can be maintained even when a deposition amount is increased.

DETAILED DESCRIPTION

Hereinafter, a film formation apparatus according to a first embodiment of the present invention will be described with reference to the drawings. The present embodiment is specifically explained for appropriate understanding the scope of the present invention, and does not limit the present invention unless otherwise specified.

Figure 1:
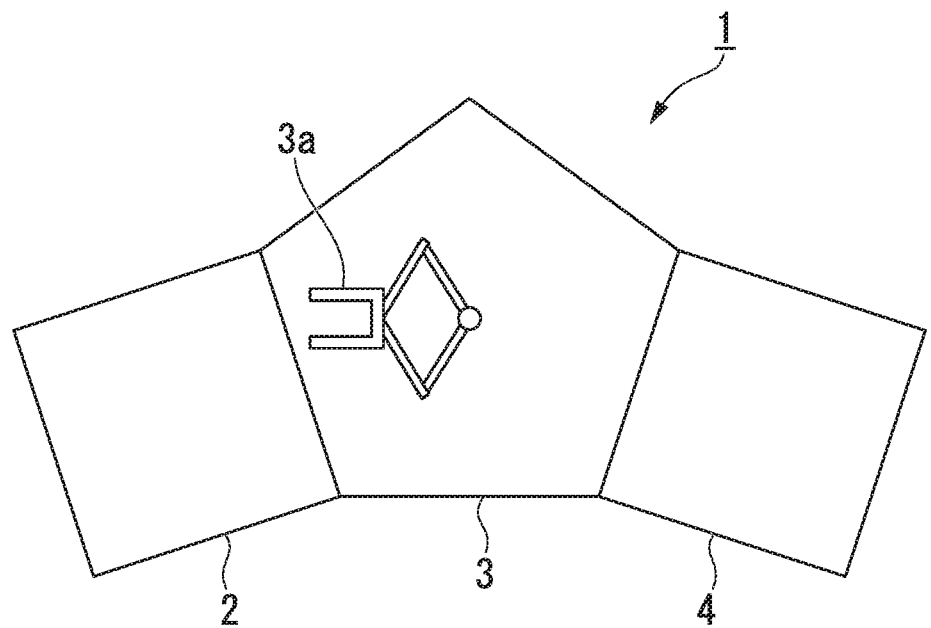
FIG. 1 is a schematic plan view showing a film formation apparatus according to a first embodiment of the present invention.
Figure 2:
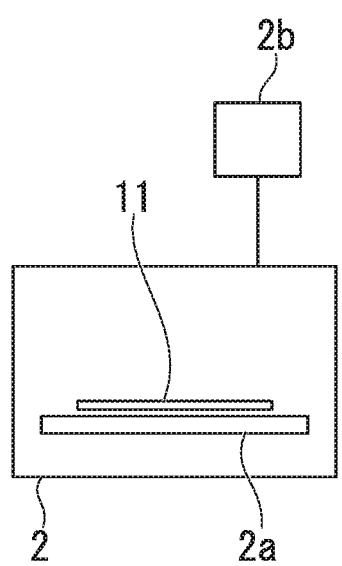
FIG. 2 is a schematic side view showing a loading/unloading chamber of the film formation apparatus according to the first embodiment of the present invention.
Figure 3:
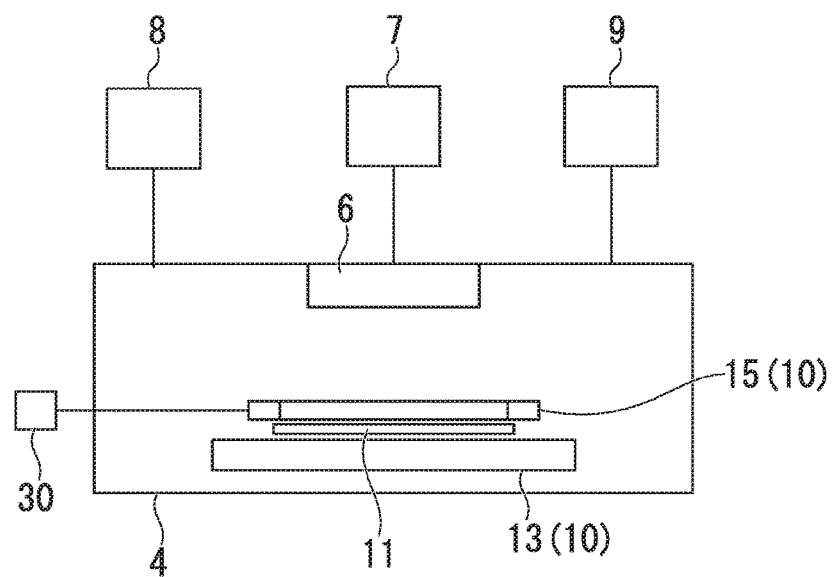
FIG. 3 is a schematic side view showing a deposition chamber of the film formation apparatus according to the first embodiment of the present invention.
Figure 4:
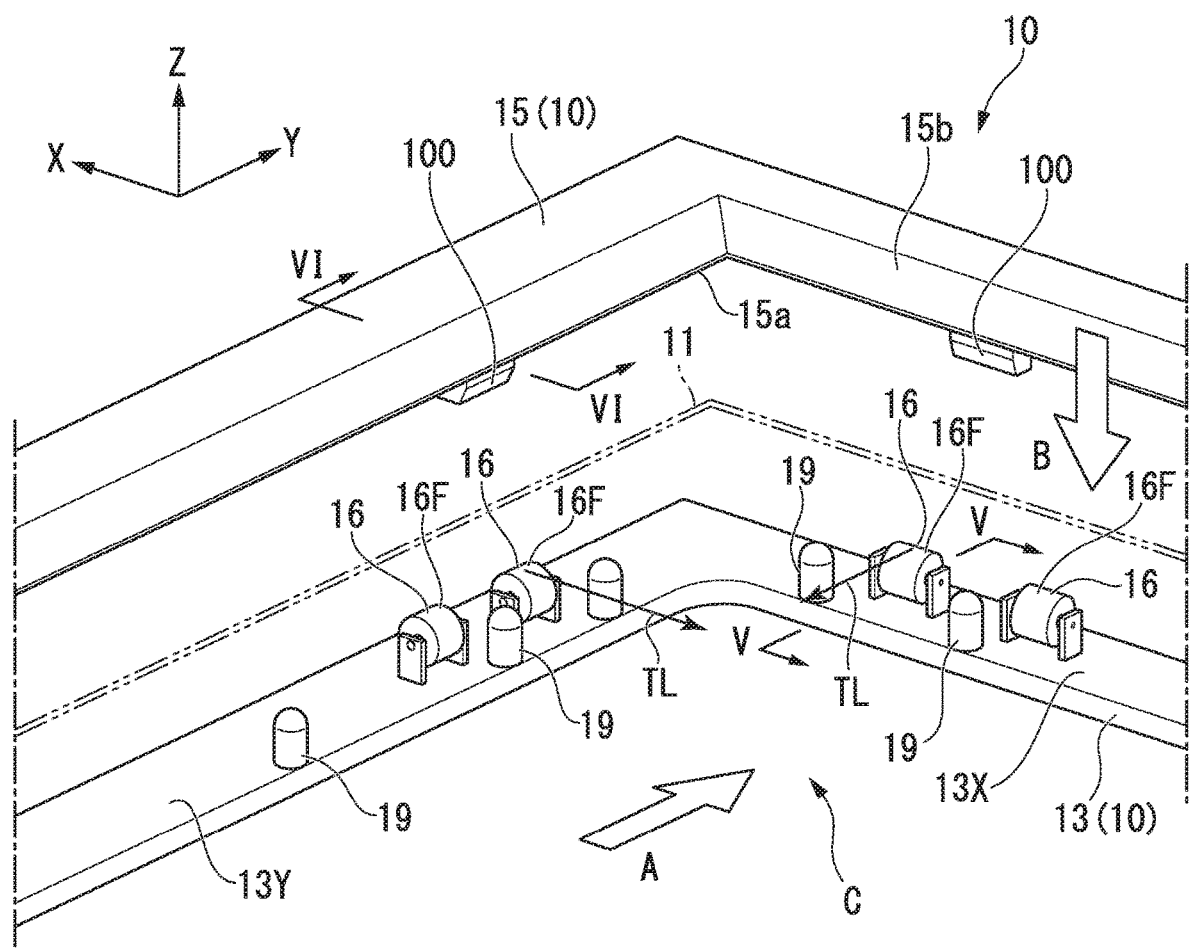
FIG. 4 is a perspective view showing a holding device of the film formation apparatus according to the first embodiment of the present invention.

FIG. 1 is a schematic plan view showing a film formation apparatus according to the present embodiment. FIG. 2 is a schematic side view showing a loading/unloading chamber of the film formation apparatus according to the present embodiment. FIG. 3 is a schematic side view showing a deposition chamber of the film formation apparatus according to the present embodiment. FIG. 4 is a perspective view showing a holding device of the film formation apparatus according to the present embodiment. In the drawings, reference numeral 1 denotes a film formation apparatus.

The film formation apparatus 1 (sputtering apparatus) according to the present embodiment is an inter-back type or in-line type vacuum processing apparatus that performs thermal processing, deposition processing, etching processing, or the like on a substrate to be processed made of glass or a resin in a vacuum environment, for example, in a case in which a thin film transistor (TFT) is formed on a substrate to be processed (glass substrate, substrate) made of glass or the like in a manufacturing process of a liquid crystal display.

As shown in FIGS. 1 and 2, the film formation apparatus 1 includes a loading/unloading chamber 2 into and from which a glass substrate 11 (substrate to be processed) made of a substantially rectangular glass is loaded and unloaded, a pressure-resistant deposition chamber 4 (chamber) in which a film, for example, such as a ZnO-based or $In_2O_3$-based transparent conductive film is formed on the glass substrate 11 using a sputtering method, and a transfer chamber 3 (chamber) positioned between the deposition chamber 4 and the loading/unloading chamber 2 (chamber). As shown in FIG. 2, a sputter-down type sputtering apparatus is employed as the film formation apparatus 1 according to the present embodiment, but a side-sputter type sputtering apparatus or a sputter-up type sputtering apparatus can also be employed.

Further, although not shown, a plurality of deposition chambers 4 (chambers) and a plurality of loading/unloading chambers 2 (chambers) can be provided in the film formation apparatus 1. In this case, the plurality of chambers can be formed to surround a periphery of the transfer chamber 3. Such chambers may be constituted by, for example, two loading/unloading chambers (chambers) formed adjacent to each other, and a plurality of processing chambers (chambers). For example, among the two loading/unloading chambers, one loading/unloading chamber can be used as a loading chamber that loads the glass substrate 11 from the outside toward the vacuum processing apparatus (film formation apparatus 1), and the other loading/unloading chamber can be used as an unloading chamber that unloads the glass substrate 11 from the film formation apparatus 1 to the outside.

A gate valve may be formed between each of these chambers 2 and 4, and the transfer chamber 3, and between the loading/unloading chamber 2 (chamber) and the outside.

As shown in FIG. 2, a positioning member 2a capable of setting and aligning a placement position of the glass substrate 11 loaded in from the outside of the film formation apparatus 1 is disposed inside the loading/unloading chamber 2.

A rough evacuation device 2b (low-vacuum evacuation device) such as a rotary pump that vacuum-evacuates the inside of the loading/unloading chamber 2 to a rough vacuum is also provided in the loading/unloading chamber 2.

As shown in FIG. 1, a transfer device 3a (transfer robot) is disposed inside the transfer chamber 3.

The transfer device 3a includes a rotating shaft, a robot arm attached to the rotating shaft, a robot hand formed at one end of the robot arm, and a vertically moving device that vertically moves the robot hand. The robot arm is constituted by first and second active arms bendable with respect to each other and first and second driven arms. The transfer device 3a can move the glass substrate 11 which is an object to be transferred between each of the chambers 2 and 4, and the transfer chamber 3.

As shown in FIG. 3, a holding device 10 that holds the glass substrate 11 during deposition is provided inside the deposition chamber 4. The holding device 10 may include a heater that heats the glass substrate 11. In the deposition chamber 4, a backing plate 6 (a cathode electrode, a sputtering cathode) provided to stand at a position facing the heater and configured to function as a supply device that supplies a deposition material, a power supply 7 which applies a sputtering voltage of a negative potential to the backing plate 6, a gas introduction unit 8 which introduces a gas into the deposition chamber 4, and a high-vacuum evacuation device 9 such as a turbo molecular pump or the like which vacuum-evacuates the inside of the deposition chamber 4 to a high vacuum are provided. A target is fixed on a front surface side of the backing plate 6 which faces the glass substrate 11 substantially parallel thereto.

A driving device 30 which causes a deposition preventing plate 15 and a holder 13 which constitute the holding device 10 to separate from and come close to each other is provided outside the deposition chamber 4. In an example shown in FIG. 3, the driving device 30 is connected to the deposition preventing plate 15, and a relative distance between the deposition preventing plate 15 and the holder 13 is controlled by the driving device 30. The driving device 30 may be connected to the holder 13 without being connected to the deposition preventing plate 15. Further, the driving device 30 may be connected to both the deposition preventing plate 15 and the holder 13.

Figure 5:
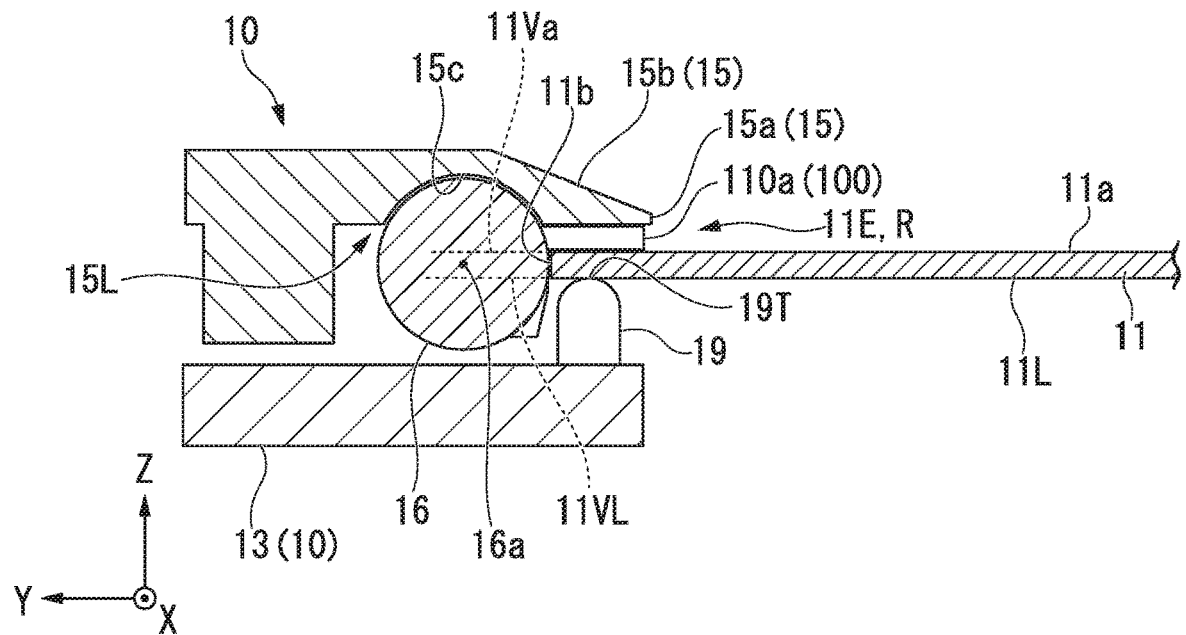
FIG. 5 is a cross-sectional view taken along line V-V in FIG. 4 showing the holding device of the film formation apparatus according to the first embodiment of the present invention, and is a view showing a state in which a glass substrate is sandwiched between a deposition preventing plate and a holder.
Figure 6:
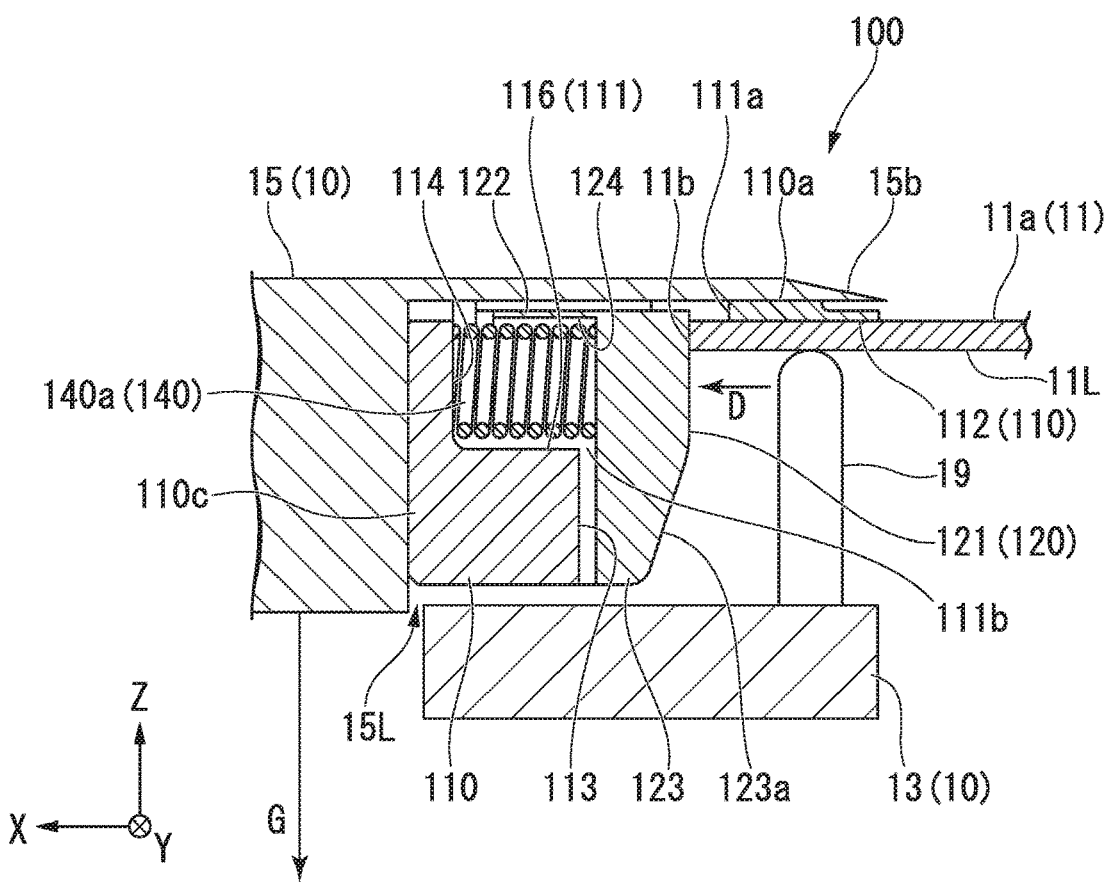
FIG. 6 is a cross-sectional view taken along line VI-VI in FIG. 4 showing the holding device of the film formation apparatus according to the first embodiment of the present invention, and is a view showing a state in which a glass substrate is sandwiched between the deposition preventing plate and the holder.

FIG. 5 is a cross-sectional view showing a structure near a position setter of the holding device in the present embodiment. FIG. 6 is a cross-sectional view showing a substrate guide of the holding device in the present embodiment. FIG. 5 is a cross-sectional view taken along line V-V in FIG. 4, and is a view showing a state in which a glass substrate is sandwiched between the deposition preventing plate and the holder. FIG. 6 is a cross-sectional view taken along line VI-VI in FIG. 4, and is a view showing a state in which a glass substrate is sandwiched between the deposition preventing plate and the holder.

As shown in FIGS. 3 to 5, the holding device 10 includes the holder 13 that holds a back surface 11L of the glass substrate 11, a deposition preventing plate 15 that covers an edge portion 11E of the glass substrate 11 and a region R to which a deposition material adheres in the holding device 10, a roller 16 (position setter) which sets a position of the glass substrate 11 when the glass substrate 11 is sandwiched and held by the deposition preventing plate 15 and the holder 13, and a substrate guide 100 (support member) that comes into contact with a peripheral edge end surface portion 11b of the glass substrate 11 to support the glass substrate 11.

The holder 13 has a structure supporting a peripheral edge portion (edge portion 11E) of the glass substrate 11 from the back surface 11L of a processing surface 11a (surface)

during deposition processing of the glass substrate 11, and has a frame body shape slightly larger than an outer contour of the glass substrate 11. A heater (not shown) is disposed inside the frame-shaped holder 13. The heater can heat the glass substrate 11 supported by the holder 13 from the back surface 11L.

The holder 13 includes a plurality of support protrusions 19 that come into contact with the back surface 11L of the glass substrate 11 to support the glass substrate 11. The plurality of support protrusions 19 protrude from a surface of the holder 13 (a surface facing the deposition preventing plate 15) toward the back surface 11L (support side) of the glass substrate 11. The plurality of support protrusions 19 are disposed to correspond to a shape of the outer contour of the glass substrate 11.

Similarly to the roller 16 to be described below, each of the support protrusion 19 has heat resistance and vacuum resistance with respect to processing such as sputtering and is formed of a resin having a strength capable of supporting the glass substrate 11. As such a resin, a polyimide resin such as Vespel (registered trademark, manufactured by Du Pont) or the like is an exemplary example.

Each of the plurality of rollers 16 provided in the holder 13 has an axis parallel to an extending direction of a straight portion 13X (first straight portion, side) or a straight portion 13Y (second straight portion, side) which forms the frame of the holder 13. Each of the rollers 16 is rotatable around this axis. Specifically, as shown in FIGS. 4 and 5, the plurality of rollers 16 are disposed on the straight portions 13X and 13Y of the holder 13 so that a tangent line TL (a tangent line perpendicular to the axis and parallel to the holder 13) of a rotational curved surface 16F of each roller 16 extends toward a center of the holder 13. As a result, in a state in which the plurality of rollers 16 are rotatable due to the axis parallel to the peripheral edge end surface portion 11b of the glass substrate 11 held by the holder 13, the rotational curved surface 16F of the roller 16 can come into contact with the peripheral edge end surface portion 11b of the glass substrate 11.

Further, each of the plurality of rollers 16 can be provided at a position near a corner C (both sides of the corner C) which is a portion at which the straight portions 13X and 13Y of the rectangular holder 13 intersect (connect). Thereby, in the holder 13, the rollers 16 are respectively positioned on two pairs of straight portions (sides) facing each other, that is, on the two straight portions 13X and the two straight portions 13Y. Also, a disposition of the plurality of rollers 16 and the number of plurality of rollers 16 in the holder 13 can be appropriately set according to a shape and size of the outer contour of the glass substrate 11, a state of the glass substrate 11 being supported at the time of processing, and the like.

Specifically, two or four rollers 16 can be disposed on both sides of the corner C at which two adjacent sides of the holder 13 are connected, that is, at positions adjacent to the corner C at which the straight portions 13X and 13Y are connected. That is, 8 to 16 rollers 16 in total can be disposed in four corner regions constituting the holder 13. Further, the rollers 16 can be disposed at positions on both sides of the support protrusion 19 in a direction in which the straight portions 13X and 13Y of the holder 13 extend.

As shown in FIGS. 4 and 5, the rotational curved surface 16F of the roller 16 comes into contact with the peripheral edge end surface portion 11b of the glass substrate 11 and then a support position in an in-plane direction of the glass substrate 11 with respect to the holder 13 is set. Further, positions of the roller 16 and the support protrusion 19 are set so that a rotation axis 16a of the roller 16 is positioned between a plane 11Va which is an extension of the surface 11a of the glass substrate 11 in a supported state and a plane 11VL which is an extension of the back surface 11L thereof. That is, a position of the rotation axis 16a of the roller 16 is positioned at a distance of approximately half of a thickness of the glass substrate 11 from a distal end 19T of the support protrusion 19 in a thickness direction of the glass substrate 11 in a supported state.

A dimension (diameter) of the roller 16 in a radial direction may be larger than a thickness of the glass substrate 11, but, for example, a diameter of the roller 16 can be three times the thickness of the glass substrate 11 or more.

The roller 16 has heat resistance and vacuum resistance with respect to processing such as sputtering and is formed of a resin having a strength capable of supporting the glass substrate 11. As such a resin, a polyimide resin such as Vespel (registered trademark, manufactured by Du Pont) or the like is an exemplary example.

As shown in FIGS. 4 and 5, the deposition preventing plate 15 faces the holder 13 to sandwich and hold the glass substrate 11 with the holder 13. The deposition preventing plate 15 is formed in a rectangular shape for covering the region R in which a deposition material is not desired to be adhered in the holding device 10 and a non-deposition region (edge portion 11E) of a peripheral edge of the glass substrate 11 supported by the holder 13. As described above, the deposition preventing plate 15 is provided to cover a portion from an outer peripheral portion of the holding device 10 to an outer peripheral portion of the glass substrate 11, and the deposition preventing plate 15 is provided to cover a region to which particles sputtered out from the target of the backing plate 6 adhere other than the glass substrate 11.

As shown in FIGS. 4 and 5, at a central portion of the deposition preventing plate 15, an opening 15a penetrating in a thickness direction of the deposition preventing plate 15 is formed so that a deposition material reaches the processing surface 11a (surface) of the glass substrate 11. An inclined portion 15b is formed at an edge portion (inner end) of the opening 15a. The inclined portion 15b has an inclined surface such that a thickness of the inclined portion 15b decreases in a direction from an outer side of the glass substrate 11 toward a center thereof. That is, the opening 15a is formed so that an opening area of the opening 15a decreases in a direction from a surface side of the deposition preventing plate 15 to a back surface side thereof, and thereby the inclined portion 15b is formed on an inner peripheral surface of the opening 15a.

As shown in FIG. 5, a recess 15c corresponding to a shape of the roller 16 is formed on a back surface side 15L (back surface) of the deposition preventing plate 15. A surface of the roller 16 facing the deposition preventing plate 15 is positioned in the recess 15c in a state of supporting the glass substrate 11, and thereby the roller 16 is configured not to come into contact with the deposition preventing plate 15.

As shown in FIG. 4, the deposition preventing plate 15 is provided to be parallel to the holder 13, and provided such that a separation distance between the deposition preventing plate 15 and the holder 13 is variable by causing the deposition preventing plate 15 and the holder 13 to separate from and come close to each other. At this time, the separation distance between the deposition preventing plate 15 and the holder 13 changes in a direction indicated by an arrow B in FIG. 4 while maintaining a state of being parallel to each other.

The holding device 10 can drive the deposition preventing plate 15 and the holder 13 such that the separation distance therebetween is changed to sandwich the glass substrate 11 between the deposition preventing plate 15 and the holder 13 so that the glass substrate 11 can be held or released.

As described above, the driving device 30 that drives the deposition preventing plate 15 is provided in the holding device 10 according to the present embodiment. The driving device 30 that drives the deposition preventing plate 15 is provided outside the deposition chamber 4 (chamber). For example, a distance between the holder 13 and the deposition preventing plate 15 can be set by a driving pin (driving device) or the like extending in a normal direction of the deposition preventing plate 15 and the holder 13. This driving pin can be configured to move forward and backward by the driving device 30 such as a driving motor disposed outside the deposition chamber 4 (chamber). The driving pin and the driving device 30 can drive the deposition preventing plate 15 in a state in which the chamber 4 is kept sealed.

The deposition preventing plate 15 may be, for example, a rectangular plate shape made of titanium, ceramic, or the like configured to be attachable to and detachable from the holder 13.

As an attaching/detaching structure of the deposition preventing plate 15, for example, a detachable bar extending in a normal direction of the frame-shaped deposition prevention plate 15 may be provided on the back surface side 15L (surface close to the glass substrate 11) of the deposition preventing plate 15. The detachable bar may be connected to a position restricting member that restricts movement of the deposition preventing plate 15 of the holding device 10 via a connecting member. The detachable bar is a columnar member provided in a normal direction of the deposition preventing plate 15, and is accommodated in an accommodation portion provided in the position restricting member.

Thereby, the deposition preventing plate 15 can be taken out to the outside of the chambers 2, 3, and 4 using the transfer device 3a (transfer robot) of the transfer chamber 3. Further, attachment of a new deposition preventing plate 15 transferred from the loading/unloading chamber 2 can be carried out by using the transfer device 3a (transfer robot).

Also, a plurality of substrate guides 100 (support members) positioned on a peripheral edge of the opening 15a are provided on the back surface side 15L of the deposition preventing plate 15.

As shown in FIG. 6, each of the substrate guides 100 includes a base 110, a substrate support 120, and a coil spring 140 (a force-applying member).

The base 110 and the substrate support 120 have heat resistance and vacuum resistance with respect to processing such as sputtering and are formed of a resin having a strength capable of supporting the glass substrate 11. As such a resin, a polyimide resin such as Vespel (registered trademark, manufactured by Du Pont) or the like is an exemplary example.

The base 110 is attached to the back surface side 15L of the deposition preventing plate 15 and accommodates the substrate support 120 that comes into contact with the glass substrate 11.

The substrate support 120 is accommodated in the base 110 such that a planar support 121 protrudes from a center of the base 110 in a normal direction of the peripheral edge end surface portion 11b of the glass substrate 11. The planar support 121 of the substrate support 120 comes into contact with the peripheral edge end surface portion 11b of the glass substrate 11 held by the holding device 10 substantially in parallel. The substrate support 120 is attached to the base 110 to be movable in an in-plane direction along the surface 11a and the back surface 11L of the glass substrate 11, that is, in a normal direction of the peripheral edge end surface portion 11b.

In a state of being accommodated in the base 110, a force is applied to the substrate support 120 in a normal direction of the peripheral edge end surface portion 11b of the glass substrate 11, that is, in a normal direction of the opening 15a of the deposition preventing plate 15 with respect to the base 110 by the coil spring 140.

As shown in FIG. 6, the base 110 has a substantially rectangular parallelepiped shape. Inside the base 110, an internal space 111 in which the substrate support 120 is accommodated.

The internal space 111 of the base 110 includes openings 111a and 111b. The opening 111a is open in a back surface 110a attached to the back surface side 15L of the deposition preventing plate 15. The opening 111b is open inside the opening 15a of the deposition preventing plate 15. On the back surface 110a of the base 110, a plate-shaped contact portion 112 is formed to extend in a direction in which the back surface 110a extends.

The internal space 111 of the base 110 has a substantially rectangular cross section in a rear view. This cross section is a substantially rectangular cross section in which substantially the entire internal space 111 is open by the back surface 110a. The internal space 111 of the base 110 in a vertical direction of FIG. 6 is formed to have a dimension smaller than approximately half of a dimension of the internal space 111 of the back surface 110a.

The internal space 111 of the base 110 is open through the opening 111a such that both ends of the contact portion 112 are left in a vertical direction with respect to a paper surface of FIG. 6. In other words, the base 110 is connected to the contact portion 112 to surround the opening 111a. On a surface of the base 110 on the right side of FIG. 6, an upper groove 113 is formed. In a vertical direction with respect to the paper surface of FIG. 6, a width dimension of the upper groove 113 is equal to a dimension of the internal space 111. The upper groove 113 is formed in the base 110 to extend in a vertical direction in FIG. 6.

In the internal space 111, a surface of the base 110 positioned on a lower side in FIG. 6 is a movement position restricting sliding surface 116. The movement position restricting sliding surface 116 comes into contact with the substrate support 120 and restricts a movement position of the substrate support 120. In a vertical direction with respect to the paper surface of FIG. 6, two movement position restricting sliding surfaces 116 positioned on substantially the same plane are formed.

In the internal space 111 of the base 110, the coil spring 140 having an extendable and contractible axis line in a lateral direction of FIG. 6 is accommodated. The base 110 has a contour shape separated from the glass substrate 11 placed by the planar support 121 of the substrate support 120, except for the contact portion 112.

The contact portion 112 has a substantially rectangular contour shape when viewed from the back surface 110a side and has a size such that the glass substrate 11 placed on the substrate guide 100 does not directly come into contact with the back surface side 15L of the deposition preventing plate 15. Specifically, the contact portion 112 is provided to stand from an end portion on the back surface 110a of the base 110 in the right direction in FIG. 6 and has a width equal to a dimension of the base 110 in the vertical direction with respect to the paper surface in FIG. 6.

The substrate support 120 includes the planar support 121 and an accommodation portion 122. When the glass substrate 11 is placed on a surface of the planar support 121 positioned on the right side of FIG. 6, the planar support 121 comes into contact with the peripheral edge end surface portion 11b. The accommodation portion 122 is accommodated in the internal space 111 on the left end side in FIG. 6.

The accommodation portion 122 is positioned on the back surface 110a side of the base 110 and extends in a lateral direction in FIG. 6 along the internal space 111. A thickness of the accommodation portion 122 is equal to a length in the vertical direction of the internal space 111 in FIG. 6. Also, the planar support 121, which is an upper end side of the opening 111a, includes a placement portion 123. The placement portion 123 extends downward in FIG. 6 along the upper groove 113 and is formed to cover the entire length in the vertical direction of the base 110 in FIG. 6. As shown in FIG. 6, the accommodation portion 122 and the placement portion 123 have an L-shaped cross section.

As shown in FIG. 6, the accommodation portion 122 has a cross-sectional shape substantially to the same as the internal space 111 in a plan view. In the accommodation portion 122, on both end sides of the accommodation portion 122 in the vertical direction with respect to the paper surface of FIG. 6, a position restricting surface which can correspondingly come into contact with a position restricting surface of the base 110 is formed. In the accommodation portion 122, two position restricting surfaces positioned substantially on the same plane are formed in a vertical direction with respect to the paper surface of FIG. 6.

An accommodating recess 124 that accommodates the coil spring 140 is provided in the accommodation portion 122 to extend in a lateral direction in FIG. 6.

On a lower side surface of the accommodation portion 122 shown in FIG. 6, a movement position restricting sliding surface slidable with respect to the movement position restricting sliding surface 116 of the base 110 is formed. This movement position restricting sliding surface is a plane extending in a lateral direction in FIG. 6. Further, in FIG. 6, since the movement position restricting sliding surface of the accommodation portion 122 overlaps the accommodating recess 124, the movement position restricting sliding surface is not shown.

When the movement position restricting sliding surface of the accommodation portion 122 and the movement position restricting sliding surface 116 slide, a movement direction of the substrate support 120 with respect to the base 110 can be restricted in a lateral direction in FIG. 6.

A portion of the placement portion 123 positioned close to the back surface 110a is the planar support 121 which is a plane parallel to the vertical direction in FIG. 6. An inclined surface 123a is formed on a lower side of the planar support 121 in FIG. 6. The inclined surface 123a is connected to the planar support 121 and inclined leftward from a connection point between the planar support 121 and the inclined surface 123a toward a lower side in FIG. 6. The inclined surface 123a is formed to be inclined toward the outside of the opening 15a of the deposition preventing plate 15 in a direction from the planar support 121 toward a lower end portion in FIG. 6. That is, the inclined surface 123a is provided to be gradually separated from the planar support 121 in a direction from the deposition preventing plate 15 toward the holder 13 and in an in-plane direction of the surface 11a of the glass substrate 11 placed on the holder 13.

When the glass substrate 11 comes into contact with the substrate guide 100, with a movement direction of the substrate support 120 in a lateral direction of FIG. 6 restricted by the movement position restricting sliding surface 116 and the movement position restricting sliding surface of the accommodation portion 122, the coil spring 140 is compressed by a load applied to the substrate support 120 to reduce the coil length and the substrate support 120 moves in the left direction in FIG. 6 as indicated by an arrow D in FIG. 6.

Due to the movement of the substrate support 120, a reaction force against the peripheral edge end surface portion 11b of the glass substrate 11 and an impact on the peripheral edge end surface portion 11b of the glass substrate 11 due to the load applied to the substrate support 120 can be alleviated.

The contact portion 112 of the substrate guide 100 and the support protrusion 19 are disposed at positions facing each other to be able to sandwich and hold the glass substrate 11. The support protrusion 19 is disposed to correspond to a central position of the contact portion 112 of the substrate guide 100.

Further, the support protrusion 19 can also be disposed on the holder 13 in which the substrate guide 100 is not provided. Particularly, it is preferable to dispose the support protrusion 19 at positions on both sides of the roller 16.

Also, the planar support 121 of the substrate guide 100 can be disposed at a position substantially the same as an outer periphery of the roller 16 in a normal direction of the deposition preventing plate 15.

Further, the planar support 121 of the substrate guide 100 can be disposed at a position on a slightly outer side of the opening 15a of the deposition preventing plate 15 with respect to the outer periphery of the roller 16 in a normal direction of the deposition preventing plate 15. In this case, a predetermined position of the inclined surface 123a of the substrate guide 100 in an inclined direction can be disposed at substantially the same position as the outer periphery of the roller 16 in a normal direction of the deposition preventing plate 15.

Next, in the film formation apparatus 1 according to the present embodiment, deposition on the glass substrate 11 in a state in which the glass substrate 11 is held by the holding device 10 will be described.

First, a deposition process performed in the deposition chamber 4 will be described.

A sputtering gas and a reactive gas are supplied from the gas introduction unit 8 to the deposition chamber 4, and a sputtering voltage is applied from the external power supply 7 to the backing plate 6 (cathode electrode). Ions of the sputtering gas excited by plasma in the deposition chamber 4 collide with a target of the backing plate 6 to cause particles of a deposition material to be ejected. Then, after the ejected particles are coupled with the reactive gas, the particles adhere to the glass substrate 11, and thereby a predetermined film is formed on the surface of the glass substrate 11. Even in an inter-back type reactive sputtering apparatus (film formation apparatus 1) as in the present embodiment, by driving the holding device 10, it may be configured such that the held glass substrate 11 moves relative to the backing plate 6.

Next, a process before deposition on the glass substrate 11, particularly, a process of aligning the glass substrate 11 loaded into the film formation apparatus 1 will be described.

The glass substrate 11 loaded from the outside to the inside of the film formation apparatus 1 is first placed on the positioning member 2a in the loading/unloading chamber 2. At this time, the glass substrate 11 is aligned at a predetermined position on the positioning member 2a.

Next, the glass substrate 11 placed on the positioning member 2*a* of the loading/unloading chamber 2 is supported by a robot hand of the transfer device 3*a* (transfer robot) and taken out from the loading/unloading chamber 2. Then, the glass substrate 11 is transferred toward the deposition chamber 4 via the transfer chamber 3.

In the deposition chamber 4, as shown in FIG. 3, the holding device 10 is in a state in which the deposition preventing plate 15 is separated from the holder 13 (preparation position) by the driving device 30.

In this state, the glass substrate 11 that has reached the deposition chamber 4 is placed on the holder 13 of the holding device 10 by the transfer device 3*a* (transfer robot).

First, the glass substrate 11 supported by the transfer device 3*a* (transfer robot) in a state substantially parallel to the deposition preventing plate 15 and the holder 13 is inserted between the holder 13 and the deposition preventing plate 15 which are separated from each other in a direction horizontal to the holder 13 as indicated by an arrow A in FIG. 4. Thereafter, the glass substrate 11 reaches a position indicated by a broken line in FIG. 4.

At this time, a position (in-plane position) of the glass substrate 11 in an X direction and a Y direction on the surface of the holder 13 is set as a state defined by movement of the positioning member 2*a* and the transfer device 3*a* (transfer robot). However, in this state, there is a likelihood that a deviation of approximately several millimeters occurs in positions in the X direction and the Y direction.

Next, as indicated by the arrow B in FIG. 4, by the robot hand of the transfer device 3*a* (transfer robot) approaching the holder 13, the glass substrate 11 is lowered to a position at which the back surface 11L of the peripheral edge portion (edge portion 11E) of the glass substrate 11 comes into contact with the plurality of support protrusions 19.

At this time, along with movement of the glass substrate 11, the peripheral edge end surface portion 11*b* of the glass substrate 11 comes into contact with the roller 16 adjacent thereto. The roller 16 with which the peripheral edge end surface portion 11*b* of the glass substrate 11 is in contact rotates due to movement of the moving glass substrate 11 to align positions of the glass substrate 11 in the X direction and the Y direction.

As described above, the plurality of rollers 16 are provided on the straight portions 13X and 13Y of the holder 13. Accordingly, when the glass substrate 11 is placed on the holder 13, the plurality of rollers 16 are disposed at positions at both ends of respective sides of the outer contour of the rectangular glass substrate 11, that is, at positions close to corners of the rectangular glass substrate 11. Therefore, a position of the glass substrate 11 disposed between the rollers 16 provided on the straight portions facing each other can be accurately defined. That is, a position of the glass substrate 11 disposed between the rollers 16 provided on the two straight portions 13X facing each other can be accurately defined. In addition, a position of the glass substrate 11 disposed between the rollers 16 provided on the two straight portions 13Y facing each other can be accurately defined.

At the same time, a position of the glass substrate 11 in the X direction and the Y direction can be accurately defined by the rollers 16 provided on the straight portions 13X and 13Y perpendicular to each other.

As a result, the glass substrate 11 placed on the holder 13 is accurately positioned on the holder 13 in a state of being in contact with only the plurality of support protrusions 19 and the plurality of rollers 16.

Next, the deposition preventing plate 15 is lowered and comes close to the holder 13 by the driving device 30 as indicated by an arrow G in FIG. 6.

At this time, the peripheral edge end surface portion 11*b* of the glass substrate 11 comes into contact with the inclined surface 123*a* and the planar support 121 which are provided on the substrate support 120 of an adjacent substrate guide 100. The glass substrate 11 with the peripheral edge end surface portion 11*b* in contact with the planar support 121 is held at a necessary position during deposition processing with respect to the deposition preventing plate 15.

The inclined surface 123*a* is formed to incline in a direction in which the opening 15*a* extends from the planar support 121. Therefore, as indicated by the arrow D in FIG. 6, the peripheral edge end surface portion 11*b* that has come into contact with the inclined surface 123*a* is guided toward the planar support 121, and a final position setting of the glass substrate 11 is performed.

Lowering of the deposition preventing plate 15 is completed at a position at which the surface 11*a* of the glass substrate 11 is in contact with the contact portion 112.

When the movement of the deposition preventing plate 15 is stopped, as shown in FIG. 5, the surface 11*a* and the back surface 11L of the glass substrate 11 are sandwiched between the contact portion 112 and the support protrusion 19. In this state, the glass substrate 11 is disposed at a deposition processing position, held by the holding device 10, and the alignment is completed.

Thereafter, the glass substrate 11 disposed at the deposition processing position and held by the holding device 10 is held in a state in which the surface 11*a* of the glass substrate 11 and the surface of the backing plate 6 are substantially parallel to each other, and then the above-described deposition process is performed.

Further, in a state in which the glass substrate 11 is aligned, when the deposition preventing plate 15 is at a position closest to the holder 13, as shown in FIG. 5, a portion of the roller 16 facing the deposition preventing plate 15 is in a state of being positioned in the recess 15*c* of the deposition preventing plate 15, and thus the roller 16 does not come into contact with the deposition preventing plate 15.

The glass substrate 11 on which a deposition process has been completed is taken out from between the deposition preventing plate 15 raised by the driving device 30 and the holder 13 by the transfer device 3*a* (transfer robot) in a direction opposite to the arrow A in FIG. 6, and is eventually transferred from the loading/unloading chamber 2 to the outside via the transfer chamber 3. Further, other processing can also be performed in other chambers.

Figure 7:
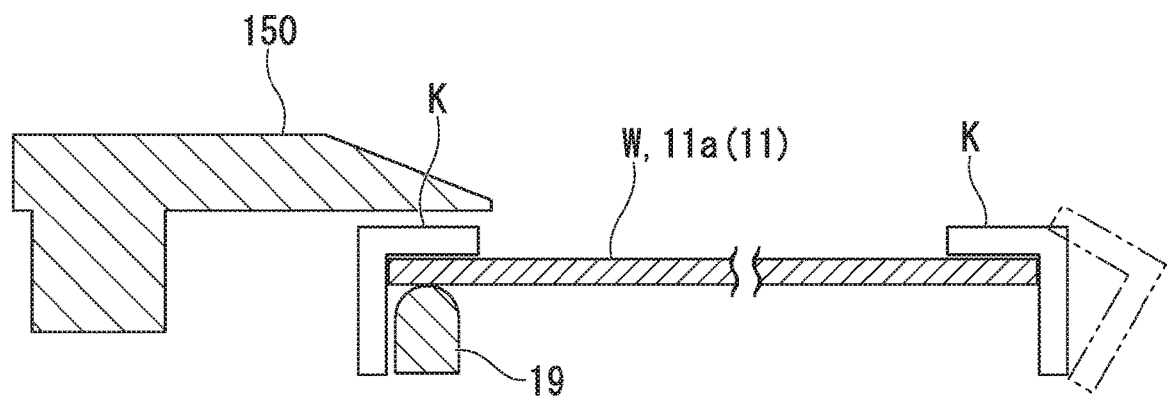
FIG. 7 is a cross-sectional view showing a clamp in a conventional film formation apparatus.

According to the film formation apparatus 1 according to the present embodiment, an alignment of the glass substrate 11 can be accurately performed without using a clamp K as shown in FIG. 7. Further, the clamp K is a member that performs an alignment of the glass substrate 11 due to a rotating operation as indicated by a broken line in FIG. 7. In this case, when a movable member is disposed in the processing chamber 4 serving as a deposition space, due to a structure having the clamp K, there is a likelihood that a problem due to generation of particles may occur.

On the other hand, in the film formation apparatus 1, the problem of generation of particles due to the structure having the clamp K can be substantially eliminated.

In FIG. 7, the clamp K is a member that holds a substrate W on a placement portion 52 by sandwiching an outer peripheral portion of the substrate W.

Also, when the substrate W is replaced by taking out a deposition preventing plate 150 to which an unnecessary deposition material has adhered from the processing chamber 4 after the deposition processing, in the structure having the clamp K, it was necessary to break a seal of the processing chamber 4 and release the processing chamber 4 to the atmosphere.

On the other hand, in the holding device 10 according to the present embodiment, the deposition preventing plate 15 after processing can be taken out by the transfer device 3a (transfer robot), and it is not necessary to release the processing chamber 4 to the atmosphere.

Further, according to the film formation apparatus 1 according to the present embodiment, as shown in FIG. 5, an alignment of the glass substrate 11 can be performed by the rotatable roller 16 coming into contact with the peripheral edge end surface portion 11b of the glass substrate 11. Therefore, unnecessary impact or load is not applied to the peripheral edge end surface portion 11b of the glass substrate 11. Thereby, occurrence of breakage or defects in the glass substrate 11 can be significantly reduced.

At the same time, the peripheral edge end surface portion 11b of the glass substrate 11 can be held by the substrate guide 100 having the substrate support 120 capable of moving the glass substrate 11 in a state in which a force is applied to the glass substrate 11. Therefore, unnecessary impact or load is not applied to the peripheral edge end surface portion 11b of the glass substrate 11. Thereby, occurrence of breakage or defects in the glass substrate 11 can be hugely reduced.

Moreover, when the glass substrate 11 comes into contact with the substrate guide 100, the glass substrate 11 has already been aligned by the roller 16. Therefore, when the inclined surface 123a is provided, a state of the glass substrate 11 with little breakage or defects can be achieved in an alignment.

Further, according to the film formation apparatus 1 of the present embodiment, since the clamp K as shown in FIG. 7 is not provided, a distance between the processing surface 11a of the glass substrate 11 and the opening 15a of the deposition preventing plate 15 is reduced, and thus a gap between the deposition preventing plate 15 and the glass substrate 11 can be reduced.

At the same time, according to the film formation apparatus 1 of the present embodiment, since the clamp K as shown in FIG. 7 is not provided, an area in contact with the processing surface 11a of the glass substrate 11 is reduced at the time of an alignment, and thereby a likelihood of scratches or the like occurring on the processing surface 11a can be substantially eliminated.

Hereinafter, a film formation apparatus according to a second embodiment of the present invention will be described with reference to the drawings.

Figure 8:
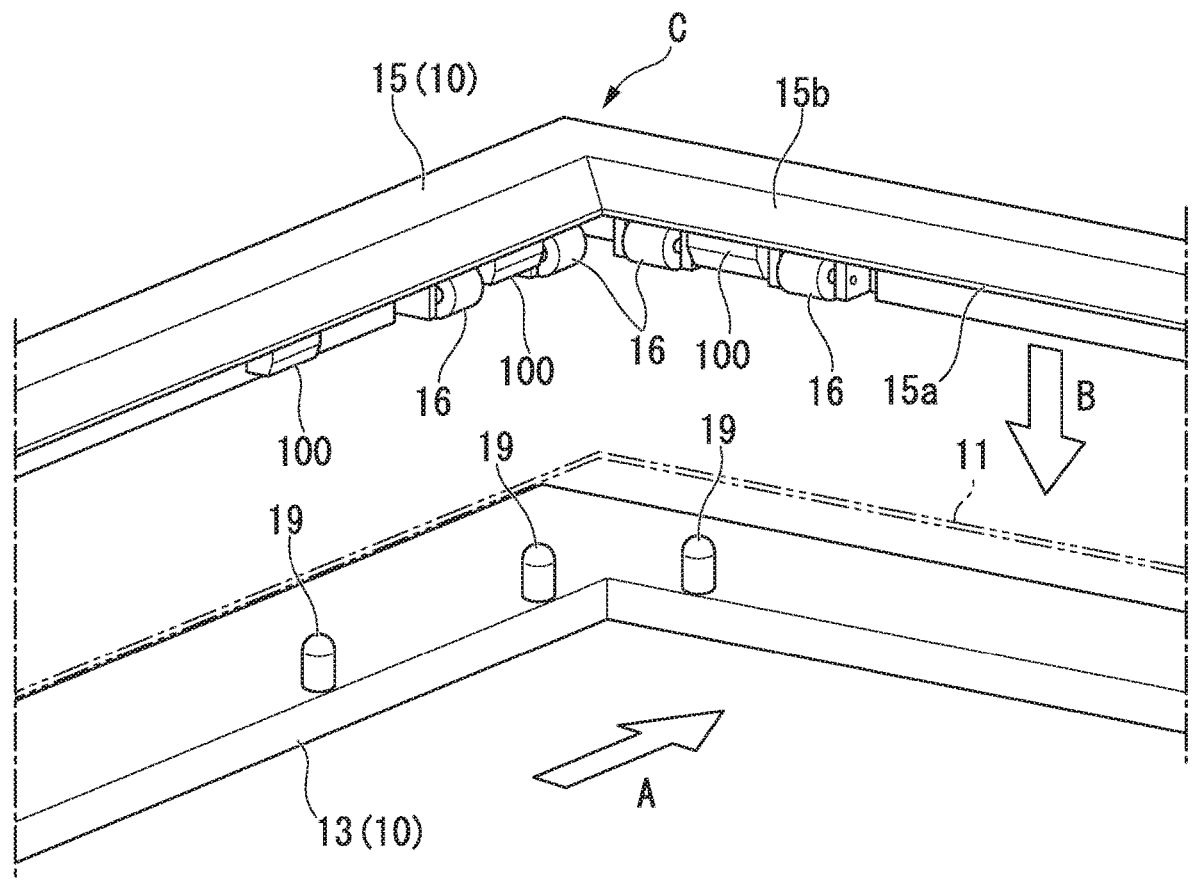
FIG. 8 is a perspective view showing a holding device in a film formation apparatus according to a second embodiment of the present invention.

FIG. 8 is a perspective view showing a holding device of the film formation apparatus according to the present embodiment, and the second embodiment is distinguished from the above-described first embodiment in terms of disposition of rollers. In FIG. 8, members the same as those in the first embodiment will be denoted by the same reference signs and description thereof will be omitted or simplified.

In a holding device 10 according to the present embodiment, a roller 16 is disposed on a deposition preventing plate 15 in the same manner as a substrate guide 100 as shown in FIG. 8.

In the holding device 10 according to the present embodiment, the roller 16 and the substrate guide 100 can be disposed adjacent to each other near a corner C of the deposition preventing plate 15 as shown in FIG. 8.

According to the present embodiment, it is possible to achieve the same effects as those in the above-described first embodiment.

Further, in this case, disposition and the number of the rollers 16 and the substrate guides 100 to be installed can be the same as those in the first embodiment.

While preferred embodiments of the invention have been described and shown above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

INDUSTRIAL APPLICABILITY

As an application example of the present invention, a sputtering apparatus, a chemical vapor deposition (CVD) apparatus, or the like is exemplary.

DESCRIPTION OF REFERENCE NUMERALS

1 Film formation apparatus (sputtering apparatus)
2 Loading/unloading chamber (chamber)
2a Positioning member
2b Rough evacuation device
3 Transfer chamber (chamber)
3a Transfer device (transfer robot)
4 Deposition chamber (chamber, processing chamber)
6 Backing plate (cathode electrode)
7 Power supply
8 Gas introduction unit
9 High-vacuum evacuation device
10 Holding device
11 Glass substrate (substrate to be processed)
11a Processing surface
11a Processing surface (surface)
11a Surface
11b Peripheral edge end surface portion
11E Edge portion
11L Back surface
11Va, 11VL Plane
13 Holder
13X, 13Y Straight portion
15, 150 Deposition preventing plate
15a Opening
15b Inclined portion
15c Recess
15L Back surface side
16 Roller (position setter)
16a Rotation axis
16F Rotational curved surface
19 Support protrusion
19T Distal end
30 Driving device
52, 123 Placement portion
100 Substrate guide (support member)
110 Base
111 Internal space
112 Contact portion
113 Upper groove
116 Movement position restricting sliding surface
120 Substrate support 121 Planar support
122 Accommodation portion
124 Accommodating recess
140 Coil spring (force-applying member)
110a Back surface
111a Opening
123a Inclined surface
C Corner
K Clamp
L Cross section
R Region
W Substrate

What is claimed is:

1. A film formation apparatus performing deposition on a substrate to be processed, the film formation apparatus comprising:
   a backing plate disposed in an evacuable vacuum chamber, wherein the backing plate includes a target fixed on it and the target supplies a deposition material;
   and a holding device that holds the substrate to be processed during deposition, the substrate to be processed having a processing surface on which a deposition material is to be deposited and a peripheral edge end surface portion around the processing surface, wherein the holding device comprises:
   a deposition preventing plate that covers a region to which the deposition material is adhered in the holding device;
   a holder that holds the substrate to be processed;
   a roller configured to set a position of the substrate to be processed when the deposition preventing plate and the holder sandwich and hold the substrate to be processed, the roller being configured to come into contact with a peripheral edge end surface portion of the substrate to be processed; and
   a substrate guide including a base, a substrate support, and a coil spring, wherein:
   the base has a plate contact portion and a spring support portion, the plate contact portion of the base is attached to a back surface side of the deposition preventing plate,
   the base accommodates the coil spring and the substrate support, the substrate support has a planar support and a spring contact portion, the planar support of the substrate support is configured to come into contact with at least the peripheral edge end surface portion of the substrate to be processed, the substrate support is movable in a normal direction of the peripheral edge end surface portion in a direction along a surface of the substrate to be processed,
   the coil spring has a first spring end and a second spring end,
   the first spring end is in contact with the spring support portion of the base,
   the second spring end is in contact with the spring contact portion of the substrate support,
   the coil spring is configured to cause the substrate support to apply a force to the peripheral edge end surface portion of the substrate to be processed in the direction along the surface of the substrate to be processed,
   wherein the roller is disposed under the deposition preventing plate and adjacent to the substrate guide; and
   when the deposition preventing plate and the holder sandwich and hold the substrate to be processed, the roller is next to the substrate guide in the direction along the surface of the substrate to be processed.

2. The film formation apparatus according to claim 1, wherein the position setter is provided in the holding device at positions that come into contact with respective edge portions of the substrate to be processed which are at positions opposite to each other.

3. The film formation apparatus according to claim 1, further comprising a driving device comprising a driving pin configured to move forward and backward by the driving device that causes the deposition preventing plate and the holder to separate from and come close to each other when the deposition preventing plate and the holder sandwich and hold the substrate to be processed is provided outside the chamber.

4. The film formation apparatus according to claim 1, wherein the roller is provided on the deposition preventing plate.

5. The film formation apparatus according to claim 1, wherein the roller is provided on the holder.

6. The film formation apparatus according to claim 1, wherein the substrate guide is provided on the deposition preventing plate.

7. The film formation apparatus according to claim 1, wherein the roller is disposed on the straight portions of the holder under the deposition preventing plate so that a tangent line of a rotational curved surface of the roller extends toward a center of the holder.

\* \* \* \* \*